United States Patent [19]

Kasami et al.

[11] 4,017,880
[45] Apr. 12, 1977

[54] RED LIGHT EMITTING GALLIUM PHOSPHIDE DEVICE

[75] Inventors: Akinobu Kasami, Yokohama; Masaru Kawachi, Tokyo; Hiroki Mineo, Yokohama, all of Japan

[73] Assignee: Tokyo Shibaura Electric Co., Ltd., Kawasaki, Japan

[22] Filed: July 25, 1975

[21] Appl. No.: 599,098

Related U.S. Application Data

[63] Continuation-in-part of Ser. No. 437,639, Jan. 29, 1974, abandoned.

[30] Foreign Application Priority Data

Feb. 12, 1973 Japan .............................. 48-17210

[52] U.S. Cl. .................................. 357/17; 357/16; 357/63
[51] Int. Cl.² ....................................... H01L 33/00
[58] Field of Search ....................... 357/17, 63, 16

[56] References Cited

UNITED STATES PATENTS

| | | | |
|---|---|---|---|
| 3,703,671 | 11/1972 | Saul | 317/235 R |
| 3,934,260 | 1/1976 | Kasami | 357/17 |

Primary Examiner—Martin H. Edlow
Attorney, Agent, or Firm—Oblon, Fisher, Spivak, McClelland & Maier

[57] ABSTRACT

A red light emitting gallium phosphide device comprises an n-type substrate, an n-type layer formed on the substrate using a liquid phase epitaxial growth method, and a p-type layer formed on the n-type layer using the liquid phase epitaxial growth method, the donor concentration of the n-type layer ranging from $1.8 \times 10^{17}$ cm$^{-3}$ to $5.8 \times 10^{17}$ cm$^{-3}$.

6 Claims, 6 Drawing Figures

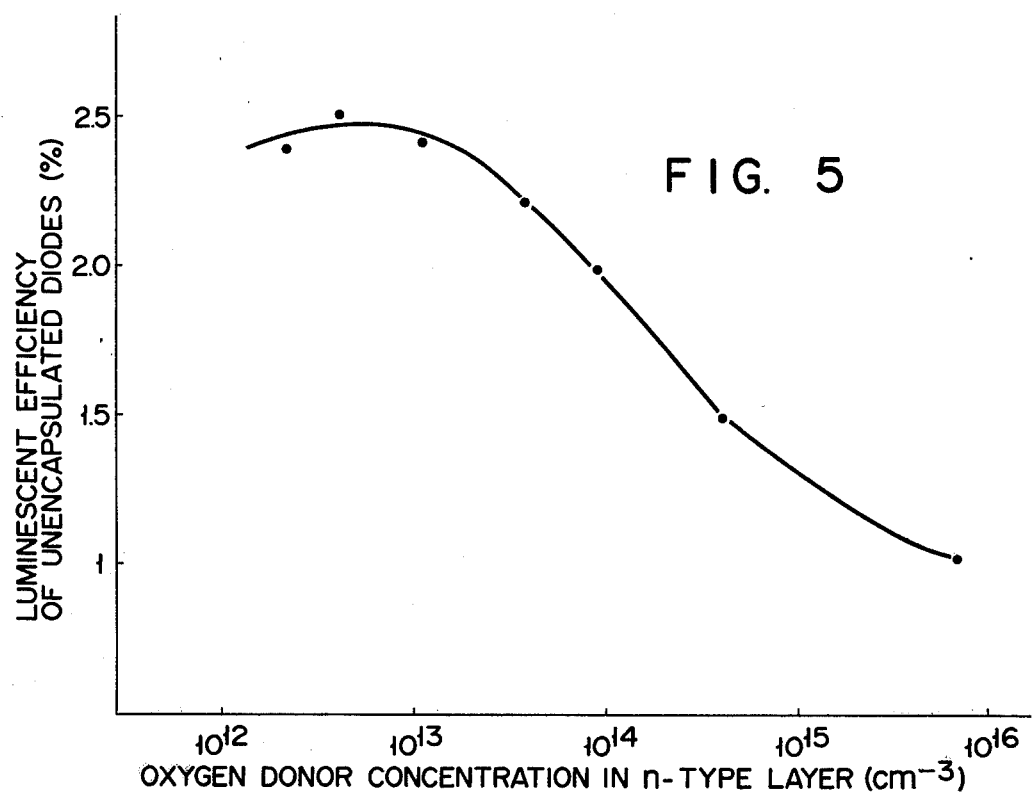
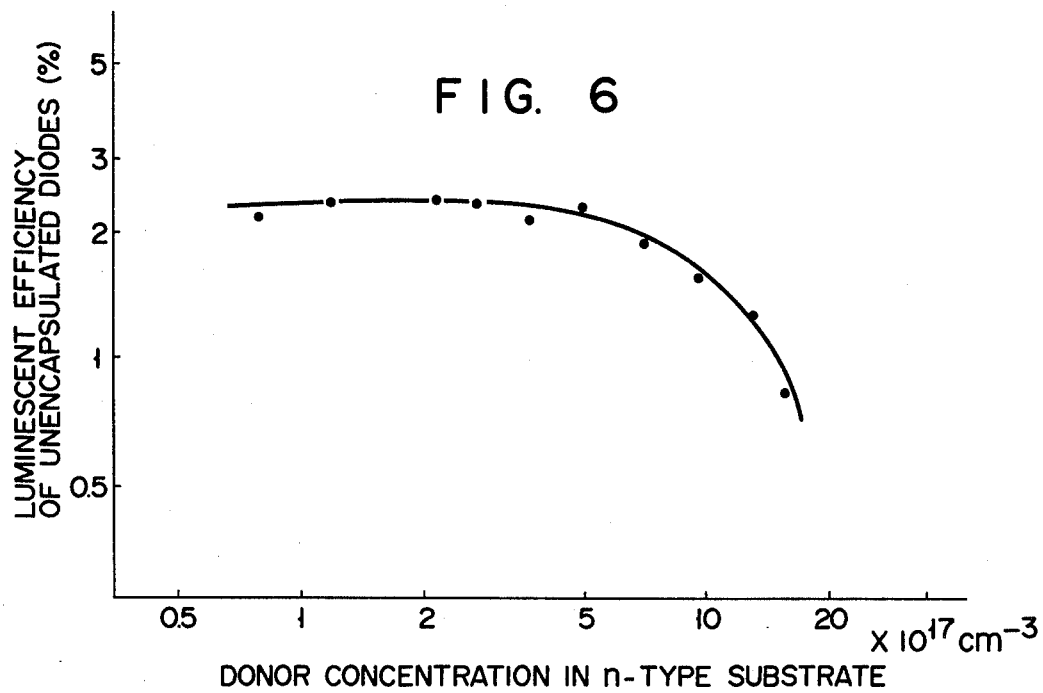

RED LIGHT EMITTING GALLIUM PHOSPHIDE DEVICE

CROSS-REFERENCE TO RELATED APPLICATION

This is a continuation-in-part application of U.S. Patent application Ser. No. 437,639 filed on Jan. 29, 1974 now abandoned.

BACKGROUND OF THE INVENTION

This invention relates to a red light emitting gallium phosphide (GaP) device having a pn-junction.

The light emitting device of this type is comprised of an n-type GaP substrate formed by a liquid-encapsulated Czochralski (LEC) method, an n-type GaP layer formed on said GaP substrate by a liquid phase epitaxial (LPE) growth method, and a zinc and oxygen-containing p-type LPE layer formed on said GaP layer.

Conventionally, with respect to this pnn-structure device, various studies have been conducted to increase its luminescent efficiency, and the following techniques are presently known as representative examples. That is to say, U.S. Pat. No. 3,703,671 states, by paying attention to the oxygen concentration $N_O$ and acceptor concentration $N_A$ in a p-type LPE layer, that when $N_O = 1 \times 10^{17}$ to $9 \times 10^{17}$ cm$^{-3}$ and $N_A = 2 \times 10^{17}$ to $10^{18}$ cm$^{-3}$, a high luminescent efficiency can be obtained. According to this U.S. patent application, the luminescent efficiency is increased by forming in the p-type layer a large number of zinc-oxygen nearest neighbor pairs each constituting a radiative center by doping the p-type layer with as much oxygen as possible and decreasing the carrier concentration of the p-type layer by compensating the acceptor with an oxygen donor which enhances the injection efficiency of the electron into the p-type layer. With respect to the donor, it is desirable, in order to increase the injection efficiency of electrons from the n-type layer into the p-type layer, that the donor concentration of the n-type layer be as high as possible, but where the donor concentration is too high, the light absorbing efficiency of the crystal is increased, so that the effect is increased that the luminescent light is reabsorbed into the crystal, to decrease the amount of light emitted into the device exterior. Said U.S. patent specification states, for the above-mentioned two reasons, that an optimum donor concentration ranges from $0.3 \times 10^{18}$ to $1.0 \times 10^{18}$ cm$^{-3}$.

SUMMARY OF THE INVENTION

From the experiments made by the inventors of this application, the following conclusions are derived. In the prior art technique, it has been thought better from the standpoint of injection efficiency that the net concentration of a conductive type-determining donor (e.g. Te or S) at that portion (about 10 $\mu$m in width) of an n-type layer which is adjacent to a pn-junction is high. As used herein, the term "net concentration" means a balance arrived at, as is well known in the art, by substracting the concentration of the minority carrier from that of the majority carrier. It has been proved, however, that where $N_D > 5.8 \times 10^{17}$ cm$^{-3}$, the crystallinity of said adjacent portion is rendered irregular or decreased to shorten the lifetime of minority carriers and simultaneously to decrease the crystallinity of a luminescent region (a p-region portion extending from the pn-junction toward the p-region by the extent of about 10 $\mu$m) grown adjacent said adjacent portion, thus to rapidly increase nonradiative recombination centers in number. As a result, in spite of having made $N_D$ high to increase the injection efficiency of electrons into the p-region, the increase of $N_D$ up to $5.8 \times 10^{17}$ cm$^{-3}$ or more conversely causes a decrease of the injection efficiency, and further causes a decrease of the rate of radiative recombination at the p-region, which leads also to a decrease of the luminescent efficiency. For this reason, a conclusion had been reached that the net concentration of a conductive type-determining donor at that portion (about 10 $\mu$m in width) of an n-type layer which is adjacent to a pn-junction should be $5.8 \times 10^{17}$ cm$^{-3}$ or less. On the other hand, as above described the net donor concentration must not be too low, and therefore another conclusion has been reached that if consideration is given from the standpoint of injection efficiency, the donor concentration should have a minimum value of $1.8 \times 10^{17}$ cm$^{-3}$.

Thus, the net donor concentration at an n-type layer portion (about 10 $\mu$m in width) adjacent a pn-junction should range from $1.8 \times 10^{17}$ to $5.8 \times 10^{17}$ cm$^{-3}$, and a luminescent element whose donor concentration falls within this range is capable of giving a luminescent efficiency of 2% or more without on epoxy resin encapsulation, which is practically demanded most widely. With respect to a lamp and a numeric display as main products each composed of light emitting diodes, said lamp and numeric display having reflective plates, it is demanded that they are lit with high luminescence by passing therethrough a small amount of current. To meet this demand, the light emitting diode is required to have a high luminescent efficiency. Conventionally, both the lamp and the numeric display were driven by using a driver composed of bipolar transistors each having a large current capacity, but have in recent years been directly driven by MOS-IC. The MOS-IC has a small current capacity as compared with the bipolar-IC, and it is therefore necessary that such lamp and numeric display are lit with high luminescence by passing therethrough a current of 10 mA at most, or preferably 5 mA or less. In order to satisfy this requirement, the light emitting diode is required to have a luminescent efficiency of 2% or more without an encapsulation.

Further, the following has been proved through the experiments made by the inventors of this application. Namely, if, in case the donor concentration at the above-mentioned n-type layer portion is set at a value ranging from $1.8 \times 10^{17}$ to $5.8 \times 10^{17}$ cm$^{-3}$, the concentration of an oxygen donor (this donor does not contribute to the conductive type-determination) in the n-type layer is properly determined, there can be obtained a diode having a higher luminescent efficiency.

That is to say, for the purpose of increasing the luminescent efficiency it was conventionally thought better to purposely dope with oxygen the n-type layer of a red light emitting diode having a prior art pnn-structure, thereby to increase the oxygen concentration, that is, usually to permit it to range from $1 \times 10^{17}$ to $9 \times 10^{17}$ cm$^{-3}$.

It has been proved, however, that where, as above described, the net donor concentration of the n-type layer is set at a low value (ranging from $1.8 \times 10^{17}$ to $5.8 \times 10^{17}$ cm$^{-3}$), the oxygen concentration is also required to be made low, i.e., that the net concentration of a conductive type-determining donor is not irrelevant to the oxygen concentration. Where, as above described, the donor concentration ranges from $1.8 \times 10^{17}$ to $5.8 \times 10^{17}$ cm$^{-3}$, this oxygen concentration is preferred to be set at a value of less than $1 \times 10^{14}$ cm$^{-3}$, and in the case of $1 \times 10^{14}$ cm$^{-3}$ or more, the crystallinity of a p-type layer formed on the n-type layer is rendered irregular to decrease the luminescent efficiency.

BRIEF DESCRIPTION OF THE DRAWING

FIG. 5 is a curve diagram illustrating the relation between the oxygen concentration in the n-type layer and the luminescent efficiency, of the red light emitting device of the invention; and FIG. 6 is a curve diagram illustrating the relation between the donor concentration in the n-type substrate and the luminescent efficiency, of the red light emitting device of the invention.

DETAILED DESCRIPTION OF THE PREFERRED EMBODIMENTS

Figure 1:
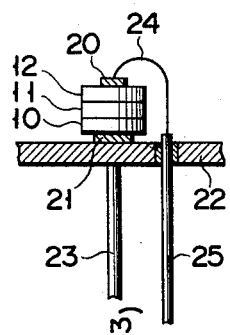
FIG. 1 is a sectional view of a red light emitting device according to an embodiment of the invention.
Figure 2:
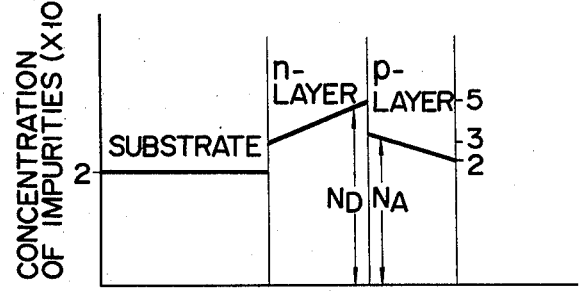
FIG. 2 is a curve diagram illustrating the impurity distribution of the red light emitting device illustrated in FIG. 1.

Hereinafter, a red light emitting gallium phosphide diode according to an embodiment of the invention is described, referring to FIGS. 1 to 3, jointly, with the method for manufacturing said diode. An n-type gallium phosphide (GaP) substrate 10 containing therein tellurium (Te) as a donor impurity (a conductive type-determining impurity), said net donor impurity concentration being $2 \times 10^{17}$ cm$^{-3}$, is prepared by a liquid-encapsulated Czochralski (LEC) method. On said substrate 10 an n-type GaP layer 11 is formed by a liquid phase epitaxial (LPE) method. Said layer 11 is doped, as a donor impurity, with tellurium and, independently from this tellurium doping, is doped with oxygen (O) to a concentration of $1 \times 10^{14}$ cm$^{-3}$. On said n-type layer 11 a p-type GaP layer 12 is formed by the LPE method. In this case, the p-type GaP layer 12 is doped, as an acceptor impurity (a conductive type-determining impurity), with zinc (Zn) and, independently from this zinc doping, is doped with oxygen (O). Said donor impurity or Te concentration, and said acceptor impurity or Zn concentration in the n-type layer 11 are so controlled as to have such a distribution as illustrated in FIG. 2. From FIG. 2 it will be seen that the n-type layer 11 has an inclined type-impurity distribution wherein the impurity concentration at the nearest n-type layer portion to the substrate is $3 \times 10^{17}$ cm$^{-3}$ and the net impurity concentration at an n-type layer portion of the pn-junction side is $5 \times 10^{17}$ cm$^{-3}$, and that the p-type layer 12 has an inclined type impurity distribution wherein the impurity concentration on the pn-junction side is $3 \times 10^{17}$ cm$^{-3}$ and the impurity concentration on the opposite side is $2 \times 10^{17}$ cm$^{-3}$. Note that the impurity distribution illustrated in FIG. 2 is merely one example and the impurity distribution of the diode of the invention is not limited thereto.

Figure 3:
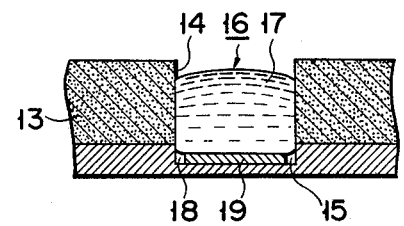
FIG. 3 is a sectional view of a liquid phase epitaxial growth device, for explaining an example of the method for manufacturing the red light emitting device of the invention.

FIG. 3 is a schematic cross sectional view of a slide type apparatus for growing an n-type gallium phosphide layer and a p-type gallium phosphide layer on an n-type gallium phosphide substrate according to the principle of the liquid phase epitaxial growth process. Referential numeral 13 denotes the body of a slide type apparatus made of carbon. The body 13 is bored with a vertically penetrating cylindrical hole 14 and has a separate carbon bottom plate 15 positioned close to the underside of the body 13, and designed to slide horizontally so as to close the vertical hole 14. Therefore the bottom plate 15 and vertical hole 14 jointly constitute a chamber 16 open at the top in the apparatus body 13. The chamber 16 is filled with an epitaxial solution 17 of gallium phosphide containing gallium phosphide and n- or p-type impurities. Part of the upper surface of the bottom plate 15 is provided with a circular recess 18 whose diameter is substantially equal to that of the vertical hole 14, said recess 18 being used to receive a substrate 19 of gallium phosphide. When, therefore, the bottom plate 15 is so slided as to bring the recess 18 right under the vertical hole 14, then the upper surface of the gallium phosphide substrate 19 touches the epitaxial solution 17.

There will now be described by way of illustration the method of preparing a red light emitting gallium phosphide diode using the slide type apparatus constructed as described above.

A single crystal of Te-doped n-type gallium phosphide with a donor concentration of $2 \times 10^{17}$ cm$^{-3}$ was prepared. A 300 micron thick substrate cut out from said single crystal was placed in the recess 18 of the bottom plate 15 with the (111) plane of said crystal kept at the top. The chamber 16 was charged with 40g of a gallium solution containing 5g of polycrystalline gallium phosphide and 4 mg of tellurium (Te). The apparatus thus loaded was heated 30 minutes at 1050° C in an electric furnace to homogenize the gallium solution. The bottom plate 15 was made to slide horizontally so as to bring the upper surface of the substrate 19 into contact with the tellurium-containing gallium solution as shown in FIG. 3. Cooling was carried out at the rate of 3° C per minute for the growth of an n-type gallium phosphide layer on the substrate 19, the thickness of said layer ranging between 60 and 70 microns. The upper surface of the n-type gallium phosphide layer was lapped out 20 microns and a thin layer of gold was deposited by evaporation on the surface of the remainder of said n-type gallium phosphide layer to provide a Schottky barrier. Measurement was made of the electric capacitance of said Schottky barrier. When calculated from the electric capacitance, the donor concentration $N_D$ at the upper surface of the n-type gallium phosphide layer was found to be $5 \times 10^{17}$ cm$^{-3}$. After the gold layer was removed from the upper surface of the n-type gallium phosphide layer, a p-type gallium phosphide layer was grown on the n-type gallium phosphide layer by bringing a solution of gallium of 40g containing 5 g of polycrystalline gallium phosphide, 20 mg of zinc (Zn) and 1 g of gallium oxide (Ga$_2$O$_3$) into contact with the upper surface of said n-type layer in the same manner as that in which the n-type gallium phosphide layer was formed on the n-type gallium phosphide substrate, thereby providing a pn-junction. A die-shaped chip, each of whose sides formed a 0.5 mm square, was cut out from a gallium phosphide diode wafer thus prepared.

The n-type side of said diode chip was fitted with a dot of indium (In) and the p-type side thereof with a dot of an indium (In)-zinc (Zn) alloy, followed by sintering at 500° C, so as to provide ohmic electrodes 20, 21. Said pnn-structure device is attached to a base 22 through the electrode 21, and a lead 23 is electrically connected to said electrode 21 while another lead 25 is electrically connected to the other electrode 20 through a wire 24. Thus, a light emitting device is completed.

When the above-constructed diode was operated by passing therethrough a current of 10 mA, a luminescent efficiency of about 2.2% was obtained in which case said diode was not encapsulated with epoxy resin.

Figure 4:
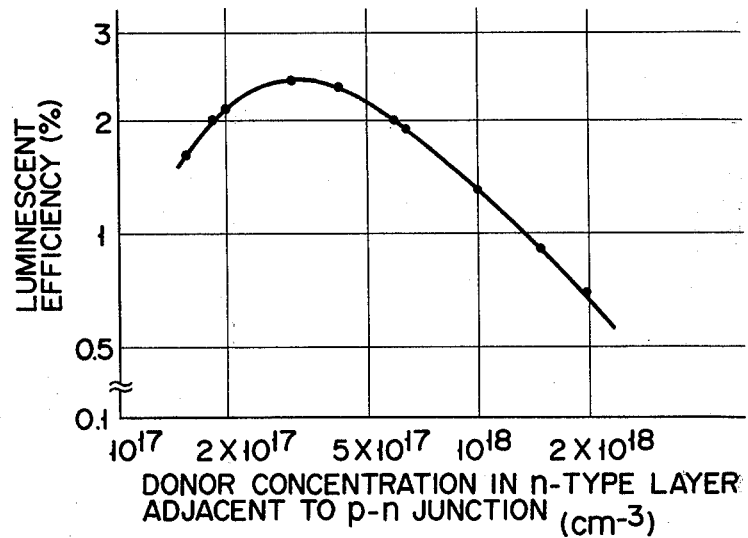
FIG. 4 is a curve diagram illustrating the relation between the donor concentration in an n-type layer and the luminescent efficiency, of the unencapsulated red light emitting device of the invention.

On the other hand, nine different gallium phosphide diodes lots were prepared in substantially the same manner as described above, excepting that a solution of gallium used for the growth of an n-type gallium phosphide layer on the n-type gallium phosphide substrate was made to contain varying amounts of tellurium (Te) so as to set the donor concentrations $N_D$ at the surface of the n-type gallium phosphide layer at $1.5 \times 10^{17}$ cm$^{-3}$, $1.8 \times 10^{17}$ cm$^{-3}$, $2 \times 10^{17}$ cm$^{-3}$, $3 \times 10^{17}$ cm$^{-3}$, $4 \times 10^{17}$ cm$^{-3}$, $5.8 \times 10^{17}$ cm$^{-3}$, $6 \times 10^{17}$ cm$^{-3}$, $1 \times 10^{18}$ cm$^3$, $1.5 \times 10^{18}$ cm$^3$ and $2 \times 10^{18}$ cm$^{-3}$ respectively. When current of 10 mA was introduced through these diodes in the forward direction, then encapsulated the diodes emitted a red light with luminescent efficiencies of 1.5%, 2.0%, 2.1%, 2.4%, 2.3%, 2.0%, 1.9%, 1.3%, 0.88% and 0.67% respectively in accordance with the above-mentioned donor concentrations as shown in FIG. 4.

As apparent from the foregoing description, the gallium phosphide emits a red light with as high a luminescent efficiency as over 2% where the donor concentration $N_D$ in the n-type gallium phosphide layer adjacent to the pn-junction ranges between $1.8 \times 10^{17}$ cm$^{-3}$ and $5.8 \times 10^{17}$ cm$^{-3}$. The reason why a higher donor concentration $N_D$ in the n-type layer than $5.8 \times 10^{17}$ cm$^{-3}$ causes the resulting gallium phosphide diode to display a lower luminescent efficiency than 2% is supposed to be that the crystallinity of the n-type gallium phosphide layer more decreases as the donor concentration $N_D$ therein increases, causing the p-type gallium phosphide layer deposited on the n-type gallium phosphide layer to be deteriorated by the introduction of a large amount of lattice defects which possibly form nonradiation recombination center. On the other hand, the reason why a lower donor concentration $N_D$ than $1.8 \times 10^{17}$ cm$^{-3}$ leads to a lower luminescent efficiency than 2% is assumed to be that such low donor concentration $N_D$ presents difficulties in maintaining the acceptor concentration $N_A$ in the p-type gallium phosphide layer at a smaller level than the donor concentration $N_D$ in the n-type gallium phosphide layer, decreasing the flow of electrons from the n-type to the p-type region and in consequence reducing the luminescent efficiency of the resulting gallium phosphide diode.

In the foregoing Example 1, tellurium (Te) as used as a donor impurity to form an n-type gallium phosphide layer.

There will now be described Example 2 in which tellurium (Te) was replaced by other n-type impurities such as sulfur (S).

EXAMPLE 2

Different types of gallium phosphide diodes were prepared in the same manner as in Example 1, excepting that 40g of a gallium solution (containing 5g of polycrystalline GaP) used for the growth of an n-type gallium phosphide layer was doped with 0.3 mg, 0.5 mg, 0.8 mg and 1.5 mg of gallium sulfide (Ga$_2$S$_3$) respectively, the results being presented in Table 1 below.

Table 1

| Doped amount of Ga$_2$S$_3$ (mg) | Donor concentration $N_D$ at the surface of the n-type GaP layer | Luminescent efficiency (%) |
|---|---|---|
| 0.2 | $2 \times 10^{17}$ cm$^{-3}$ | 2.1 |
| 0.3 | $3 \times 10^{17}$ cm$^{-3}$ | 2.4 |
| 0.5 | $5 \times 10^{17}$ cm$^{-3}$ | 2.2 |
| 0.8 | $7.5 \times 10^{17}$ cm$^{-3}$ | 1.8 |
| 1.5 | $15 \times 10^{17}$ cm$^{-3}$ | 0.88 |

In the above-mentioned device of the invention, a luminescent efficiency of 2% or more is obtained by setting at a value of $1.8 \times 10^{17}$ to $5.8 \times 10^{17}$ cm$^{-3}$ the n-type impurity concentration at an n-type layer portion in the proximity of the pn-junction. In order to increase this luminescent efficiency further, the inventors of this application determined through experiments the relation between the oxygen concentration in the n-type layer and the luminescent efficiency, the results being presented in FIG. 5. The diodes used in these experiments are the same diodes as used in the preceding embodiment excepting that they have a Te concentration of $4 \times 10^{17}$ cm$^{-3}$ and are individually different from each other in respect of oxygen concentration in the n-type epitaxial layer. It will be understood from FIG. 5 that the diode having an oxygen concentration of $1 \times 10^{13}$ cm$^{-3}$ has a most excellent luminescent efficiency; and the higher than this value the oxygen concentration is, the lower the luminescent efficiency is. Namely, when the oxygen content is too large, the luminescent efficiency would rather be decreased. Accordingly, in order to obtain a good luminescent efficiency it is preferred that the oxygen concentration be on the order of $1 \times 10^{14}$ cm$^3$ or less, or more preferably $5 \times 10^{13}$ cm$^{-3}$. The profile of a curve representing such relation between the oxygen concentration and the luminescent efficiency was confirmed to present little variation in the case where the donor concentration ranged from $1.8 \times 10^{17}$ to $5.8 \times 10^{17}$ cm$^{-3}$ and was also confirmed to present little variation with the type of impurities.

The property of the diode of the invention was investigated also concerning the relation between the n-type impurities in the GaP substrate and the luminescent efficiency, the results being presented in FIG. 6. As seen, it is preferred, from the standpoint of luminescent efficiency, that the impurity concentration in the substrate be also low, that is, $5 \times 10^{17}$ cm$^{-3}$ or less. Further, it is preferred, from the standpoint of injection efficiency, that the acceptor impurity concentration in the p-type layer be lower than the donor impurity concentration in the n-type layer. Further, since, as a result, the acceptor impurity concentration is considerably decreased as compared with the prior art case, an irregular crystallinity of the p-type layer due to the presence of this impurity is made difficult to produce.

What we claim is:

1. A red light emitting gallium phosphide device comprising an n-type gallium phosphide substrate, an n-type gallium phosphide layer formed on said substrate and a p-type gallium phosphide layer formed on said n-type layer to define a pn-junction contributing to emission of a red light between both layers, wherein the n-type layer has doped oxygen having a concentration of less than $1 \times 10^{14}$ cm$^{-3}$, the portion of the n-type layer adjacent the pn-junction having a net donor concentration of from $1 \times 10^{17}$ cm$^{-3}$ to $5.8 \times 10^{17}$ cm$^{-3}$.

2. A red light emitting gallium phosphide device according to claim 1, wherein the p-type layer has doped zinc and oxygen, and the n-type layer additionally contains tellurium therein.

3. A red light emitting gallium phosphide device according to claim 1 wherein the concentration of oxygen is less than $5 \times 10^{13}$ cm$^{-3}$.

4. A red light emitting gallium phosphide device according to claim 1 wherein the n-type substrate has a doped donor impurity having a concentration of less than $5 \times 10^{17}$ cm$^{-3}$.

5. A red light emitting gallium phosphide device according to claim 1 wherein the n-type substrate is a liquid-encapsulated Czochralski substrate, the n-type layer is a liquid phase epitaxial layer and the p-type layer is a liquid phase epitaxial layer.

6. A red light emitting gallium phosphide device according to claim 5 wherein the substrate has doped therein a donor impurity having a concentration of less than $5 \times 10^{17}$ cm$^{-3}$, the n-type layer has a donor impurity having a concentration ranging from $1.8 \times 10^{17}$ cm$^{-3}$ to $5.8 \times 10^{17}$ cm$^{-3}$, and the p-type layer has an acceptor concentration lower than that of the donor concentration in the n-type layer.

* * * * *